United States Patent
Ho

(10) Patent No.: US 6,673,719 B2
(45) Date of Patent: Jan. 6, 2004

(54) METHOD FOR ETCHING USING A MULTILEVEL HARD MASK

(75) Inventor: Kuen-Chi Ho, Chiai Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/010,505

(22) Filed: Nov. 12, 2001

(65) Prior Publication Data

US 2002/0142537 A1 Oct. 3, 2002

(30) Foreign Application Priority Data

Mar. 27, 2001 (TW) ........................................ 90107144 A

(51) Int. Cl.⁷ ...................... H01L 21/302; H01B 13/00; C03C 15/00
(52) U.S. Cl. ...................... 438/689; 438/736; 216/17; 216/47; 216/51
(58) Field of Search ................................ 438/689, 704, 438/706, 734, 735, 736, 737, 738, 743, 744, 756, 757; 216/2, 6, 13, 17, 19, 39, 41, 47, 51, 72, 74, 79, 80

(56) References Cited

U.S. PATENT DOCUMENTS

| | | | | |
|---|---|---|---|---|
| 5,913,118 A | * | 6/1999 | Wu .............................. | 438/243 |
| 6,030,541 A | * | 2/2000 | Adkisson et al. ............. | 216/51 |
| 6,303,466 B1 | * | 10/2001 | Shimonishi et al. ......... | 438/424 |
| 6,403,432 B1 | * | 6/2002 | Yu et al. ...................... | 438/296 |
| 6,432,318 B1 | * | 8/2002 | Ding et al. ................... | 216/67 |

* cited by examiner

Primary Examiner—Evan Pert
Assistant Examiner—Scott B. Geyer
(74) Attorney, Agent, or Firm—Ladas & Parry

(57) ABSTRACT

A method for physical etching using a multilevel hard mask. A substrate having a multilayer structure thereon is provided. A BPSG layer, a masking material layer and a patterned photoresist layer are sequentially formed on the multilayer structure, wherein the masking material layer has a high selective etching ratio for the BPSG layer. A pattern of the patterned photoresist layer is transferred to the masking material layer, and then transferred to the BPSG layer. The masking material layer and the BPSG layer, which function as a multilevel hard mask, are used to physically etch the multilayer structure to form a trench therein.

12 Claims, 3 Drawing Sheets

METHOD FOR ETCHING USING A MULTILEVEL HARD MASK

BACKGROUND OF THE INVENTION

1. Field of the Invention

The present invention relates in general to an etching method. In particular, the present invention relates to a method of physical etching with a multilevel hard mask.

2. Description of the Related Art

In integrated circuit industries, conducting materials, semiconductors, and insulators are widely used, and thin film deposition, photolithography and etching are the main semiconductor techniques.

The above-mentioned materials are deposited by the technique of thin film deposition on a wafer layer by layer. The technique of photolithography is used to form patterns, and then the patterns are transferred to the layers to form elements, such as transistors or capacitors, or circuits.

With the advent of integration, the element structures and circuits are more and more complicated. In some cases, the material to be etched is not a simple material but a mass of multilayer materials. For example, in the structures of vertical transistors and underlying deep trench capacitors, performing shallow trench isolation is difficult. In this case, physical etching is chosen to pattern the structure to be etched with a BPSG layer (borophosphosilicate glass layer) as a consumptive mask. The thickness of the BPSP layer depends on the depth of the opening or trench to be formed. If the BPSG layer is too thick, it is difficult to transfer the pattern in the photoresist layer to the BPSG layer, and distortion of the pattern in the BPSG layer occurs easily. Therefore, it is difficult to form a deep opening or trench in these materials by physical etching.

SUMMARY OF THE INVENTION

The object of the present invention is to provide a multilevel hard mask as a consumptive mask, and the thickness of the multilevel hard mask is not limited by the limitations of the photoresist.

To achieve the above-mentioned object, the present invention provides a method for etching a multilayer structure using a multilevel hard mask. According to one aspect, a BPSG layer, a masking material layer and a patterned photoresist layer are sequentially formed on the multilayer structure. The pattern of the patterned photoresist layer is transferred to the masking material layer. The pattern of the masking material layer is then transferred to the BPSG layer by etching under the conditions of the high etching ratio of the BPSG layer to the masking material layer. The masking material layer and the BPSG layer functioning as a multilevel hard mask are used to physically etch the multilayer structure to form a trench therein.

In accordance with another aspect of the present invention, a method for forming a shallow trench isolation with a vertical transistor and a trench capacitor includes the following steps. A substrate with a layer to be etched which contains a trench capacitor, a vertical transistor, and possibly other circuit elements, is provided. A BPSG layer, a masking material layer and a patterned photoresist layer are sequentially formed on the layer to be etched. The pattern of the photoresist layer is transferred to the masking material layer. The pattern of the masking material layer is then transferred to the BPSG layer by etching under the conditions of the high etching ratio of the BPSG layer to the masking material layer. The masking material layer and the BPSG layer functioning as a multilevel hard mask are used to physically etch the layer to be etched to form a trench therein. An insulating material then fills the trench.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Due to the complicated nature of the layer to be etched, the present invention provides a multilevel hard mask for physical etching. First, a BPSG layer with sufficient thickness is deposited on the layer to be etched. The thickness of the BPSG layer must support the consumption of itself in the physical etching process. A masking material layer and a patterned photoresist layer are sequentially formed on the BPSG layer. After the pattern of the patterned photoresist layer is transferred to the masking material layer, the patterned photoresist layer is removed. The pattern of the masking material layer is then transferred to the BPSG layer by etching under the conditions of the high etching ratio of the BPSG layer to the masking material layer. The masking material layer and the BPSG layer functioning as a multilevel hard mask are used to physically etch the layer to be etched to form a trench therein. Alternatively, the masking material layer can be removed and then only the BPSG layer functions as a hard mask.

The above-mentioned method is applied to the formation of the shallow trench isolations with vertical transistors and trench capacitors. This description is given in the following preferred embodiment.

The trench capacitor formed in the substrate is a common capacitor. In this kind of capacitor, the capacitance is enhanced by increasing the surface with a deepening of the trench capacitor. In order to condense the DRAM cells, the transistors are developed to the vertical transistors and located on the trench capacitors. The shallow trench isolations are formed after forming the vertical transistors and the trench capacitors.

FIGS. 1A~1F are cross-sections showing a fabrication method of a shallow trench isolation with vertical transistors and trench capacitors according to the present invention.

Figure 1A:
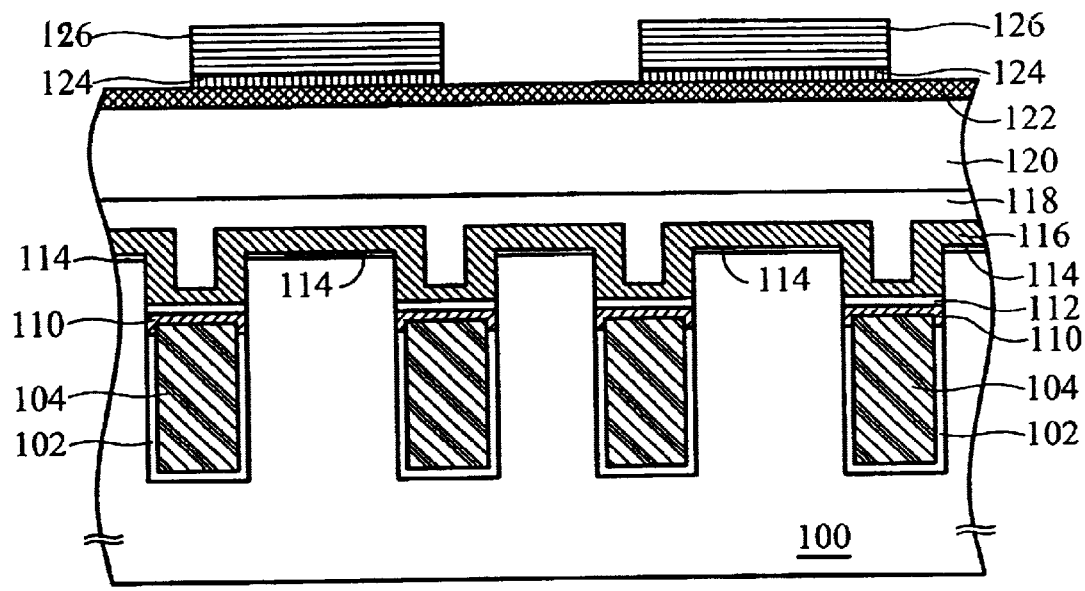
FIGS. 1A~1F are cross-sections showing a fabrication method of a shallow trench isolation with vertical transistors and trench capacitors according to the present invention.

In FIG. 1A, a substrate 100, such as a silicon semiconductor substrate, is provided. The layer to be etched, which comprises the trench capacitors and the vertical transistors, is formed on the substrate 100. For example, the layer to be etched comprises the capacitor dielectric layer 102, electrode plate 104, source 110, insulating layer 112, pad oxide layer 114, gate 116, and passivation layer 118. The material used to form the capacitor dielectric layer 102 can be an oxide layer, oxynitride layer/oxide layer or the like. The material used to form both the electrode plate 104 and the source 110 can be polysilicon. The insulator layer 112 used to isolate the source 110 from the gate 116 can be thermal oxide layer. The pad oxide layer 114 is used to isolate the gate 116 and the substrate 100. The material used to form the gate 116 can be polysilicon. Hence, the layer to be etched comprises polysilicon, silicon oxide, and silicon nitride.

A BPSG layer 120 is formed on the passivation layer 118, the thickness of which depends upon the depth of a trench formed therein and is not affected by the limitations of photolithography. The BPSG layer 120 must be thick enough to withstand the consumption of physical etching.

A masking material layer 122 is formed on the BPSG layer 120, wherein the masking material layer 122 has a high selective etching ratio for the BPSG layer 120. The material used to form the masking material layer 122 can be polysilicon, amorphous-silicon, or silicon nitride. The thickness of the masking material layer 122 is about 800~2000 Å. An anti-reflection layer 124 and a patterned photoresist layer 126 are sequentially formed on the masking material layer 122. The patterned photoresist layer 126 need not be too thick, because the patterned photoresist layer 126 only patterns the anti-reflection layer 124 and the masking material layer 122. The patterned photoresist layer 126 has a pattern of trenches. The pattern is then transferred to the anti-reflection layer 124. If the masking material layer 122 can not reflect light easily, then the anti-reflection layer 124 can be omitted.

Figure 1B:
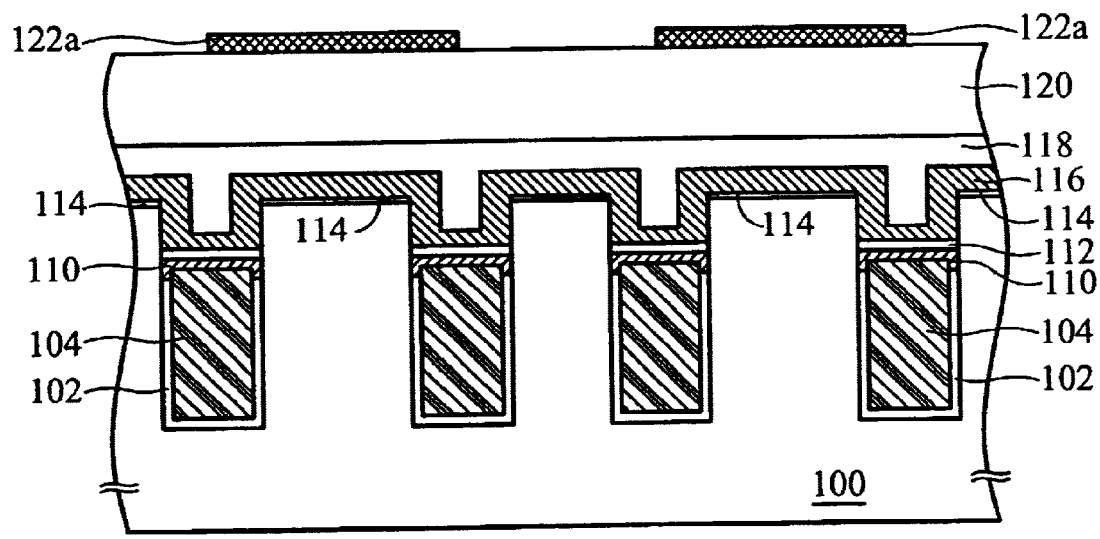

In FIG. 1B, an etching process is performed to transfer the pattern in the patterned photoresist layer 126 to the masking material layer 122 to form a patterned masking material layer 122a. The patterned photoresist layer 126 and the anti-reflection layer 124 are then removed.

Figure 1C:
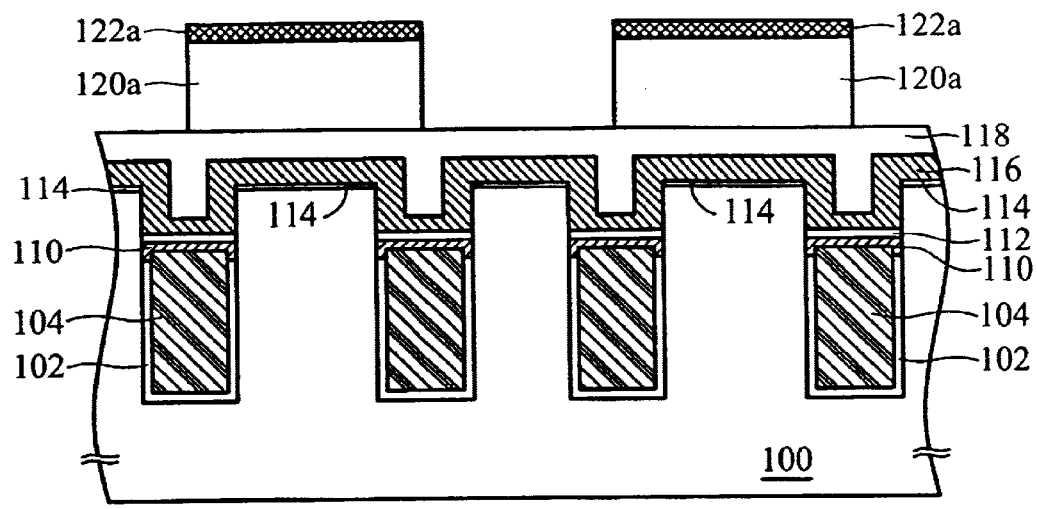

As shown in FIG. 1C, the patterned masking material layer 122a is functioning as an etching mask to pattern the BPSG layer 120 by etching under the conditions of the high etching ratio of the BPSG layer 120 to the masking material layer 122 to form the patterned BPSG layer 120a and expose the layer to be etched.

Figure 1D:
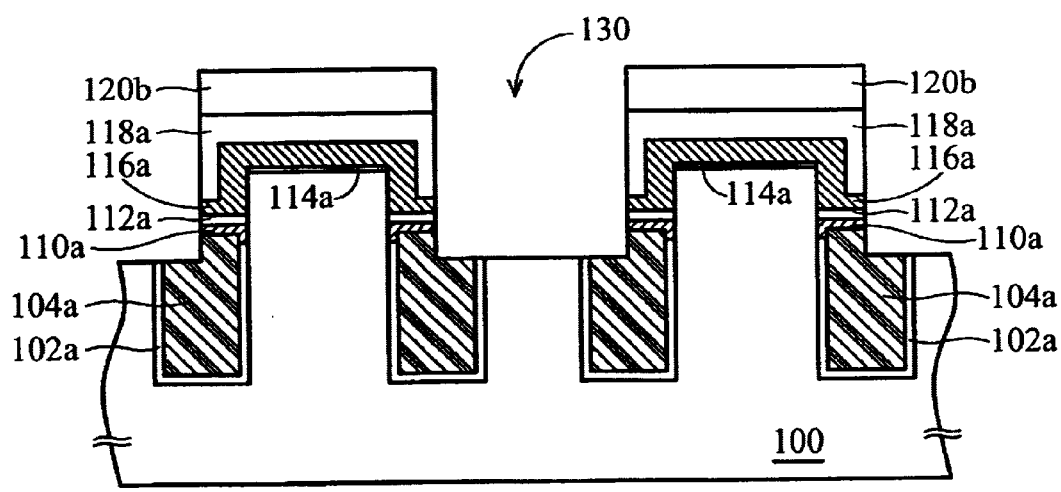

In FIG. 1D, the masking material layer 122 and the BPSG layer 120 are used as a multilevel hard mask to physically etch the layer to be etched, forming a trench therein. Alternatively, the masking material layer 122 can be removed by wet etching, and the BPSG layer 120 is then used as a hard mask to physically etch the layer to be etched to form a trench therein. The physical etching, also called sputtering etching, is conducted by momentum transfer of the ions striking the surface of the layer to be etched. The layer to be etched comprises the passivation layer 118, gate 116, pad oxide layer 114, insulating layer 112, source 110, electrode plate 104, dielectric layer 102 and substrate 100. These are transferred to a passivation layer 118a, gate 116a, pad oxide layer 114a, insulating layer 112a, source 110a, electrode plate 104a, and dielectric layer 102a.

Figure 1E:
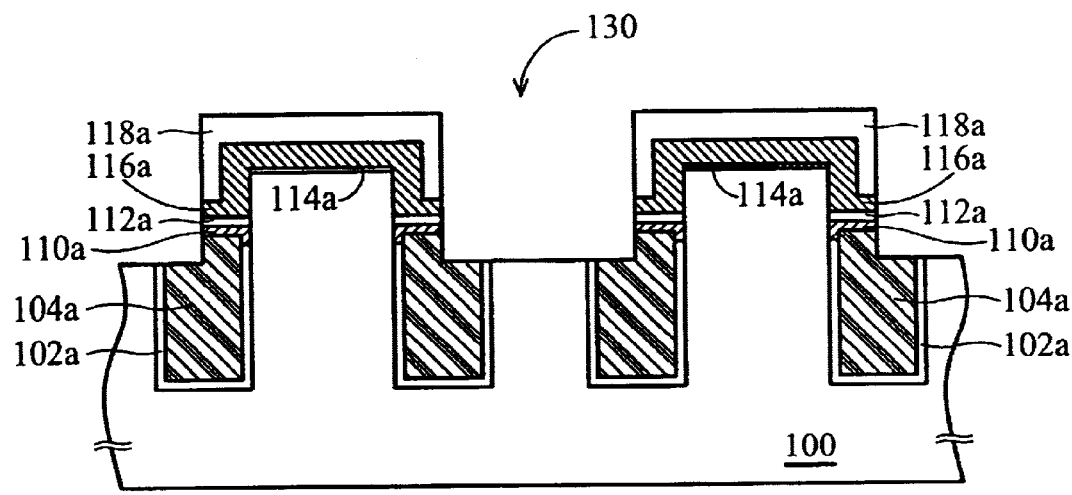

In FIG. 1E, the remaining BPSG layer 120b is removed.

Figure 1F:
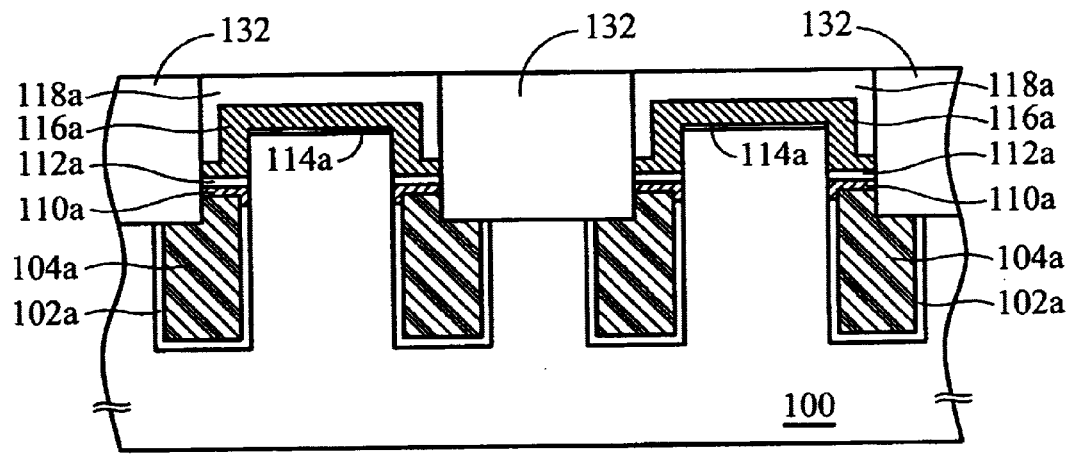

In FIG. 1F, the trench 130 is filled with an insulating material, such as silicon oxide, to form a shallow trench isolation 132.

In conclusion, the multilevel hard mask provided by the present invention is used to etch deep openings or trenches in a mass of complicated material layer. The multilevel hard mask is a consumptive obstruction. Even a thicker hard mask can be formed and used unaffected by the limitation of the photoresist in thickness. Moreover, the photoresist layer is used to pattern the masking material layer, and the BPSG layer is patterned by transferring the pattern of the masking material layer therein. Therefore, the photoresist layer need not be too thick, and the pattern is accurate without distortion.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for etching using a multilevel hard mask, comprising:

providing a substrate having a multilayer structure thereon;

forming a BPSG layer on the multilayer structure;

forming a masking material layer on the BPSG layer, wherein the masking material layer has a high selective etching ratio for the BPSG layer;

forming a patterned photoresist layer on the masking material layer;

transferring a pattern of the patterned photoresist layer to the masking material layer;

transferring the pattern of the masking material layer to the BPSG layer by etching under the conditions of the high etching ratio of the BPSG layer to the masking material layer; and using the masking material layer and the BPSG layer as a multilevel hard mask to physically etch the multilayer structure to form a trench therein.

2. The method as claimed in claim 1, wherein the masking material layer is a polysilicon layer.

3. The method as claimed in claim 1, wherein the masking material layer is an amorphous-silicon layer.

4. The method as claimed in claim 1, wherein the masking material layer is a silicon nitride layer.

5. The method as claimed in claim 1, wherein after transferring the pattern of the patterned photoresist layer to the masking material layer, the patterned photoresist layer is removed.

6. The method as claimed in claim 1, further comprising forming an anti-reflection layer between the masking material layer and the patterned photoresist layer.

7. The method of claim 5, further comprising filling the trench with an insulating material and wherein the multilayer structure has a layer to be etched which at least contains a trench capacitor and a vertical transistor.

8. A method for forming a shallow trench isolation with a vertical transistor and a trench capacitor, comprising:

providing a substrate having a layer to be etched which at least contains a trench capacitor and a vertical transistor;

forming a BPSG layer on the layer to be etched;

forming a masking material layer on the BPSG layer, wherein the masking material layer has a high selective etching ratio for the BPSG layer;

forming a patterned photoresist layer on the masking material layer;

transferring a pattern of the patterned photoresist layer to the masking material layer;

removing the patterned photoresist layer;

transferring the pattern of the masking material layer to the BPSG layer by etching under the conditions of the high etching ratio of the BPSG layer to the masking material layer;

using the masking material layer and the BPSG layer as a multilevel hard mask to physically etch the layer to be etched to form a trench therein; and filling the trench with an insulating material.

9. The method as claimed in claim 8, wherein the masking material layer is a polysilicon layer.

10. The method as claimed in claim 8, wherein the masking material layer is an amorphous-silicon layer.

11. The method as claimed in claim 8, wherein the masking material layer is a silicon nitride layer.

12. The method as claimed in claim 8, further comprising forming an anti-reflection layer between the masking material layer and the patterned photoresist layer.

* * * * *